United States Patent [19]

Millhollan et al.

[11] 4,078,261

[45] Mar. 7, 1978

[54] SENSE/WRITE CIRCUITS FOR BIPOLAR RANDOM ACCESS MEMORY

[75] Inventors: Michael S. Millhollan; Robert M. Reinschmidt, both of Tempe, Ariz.

[73] Assignee: Motorola, Inc., Schaumburg, Ill.

[21] Appl. No.: 645,967

[22] Filed: Jan. 2, 1976
(Under 37 CFR 1.47)

[51] Int. Cl.² .............................................. G11C 11/40
[52] U.S. Cl. .................................. 365/189; 365/205; 307/238
[58] Field of Search .................... 340/173 R, 173 FF; 307/238, 279

[56] References Cited

U.S. PATENT DOCUMENTS 3,983,544  9/1976  Dennison ......................... 340/173 R Primary Examiner—Terrell W. Fears
Attorney, Agent, or Firm—Joe E. Barbee

[57] ABSTRACT

A bipolar sense-write circuit is provided for sensing voltage levels representative of a logical "1" or a logical "0" stored in a flip-flop storage cell and for writing voltage levels into the flip-flop storage cell. The sense portion of the sense-write circuit is essentially independent of the write portion thereof. The sense circuitry portion of the sense-write circuit includes circuitry for biasing a pair of bit lines at substantially equal voltages at all times, except during a write cycle, to a voltage which facilitates sensing of a selected storage cell and which also results in the write circuitry being essentially electrically isolated from the sense-bit lines during a read cycle. During a write cycle, the read circuitry is effectively disabled so that the bit lines are at voltages determined by the write circuitry, and the read circuitry is effectively isolated from the sense-bit lines during the write cycle, and the write circuitry applies an increased voltage to one of the sense-bit conductors. The independence of the sense portion and write portion of the sense-write circuits results in elimination of undesirable interaction, especially write recovery problems, between the write and sense portions.

8 Claims, 1 Drawing Figure

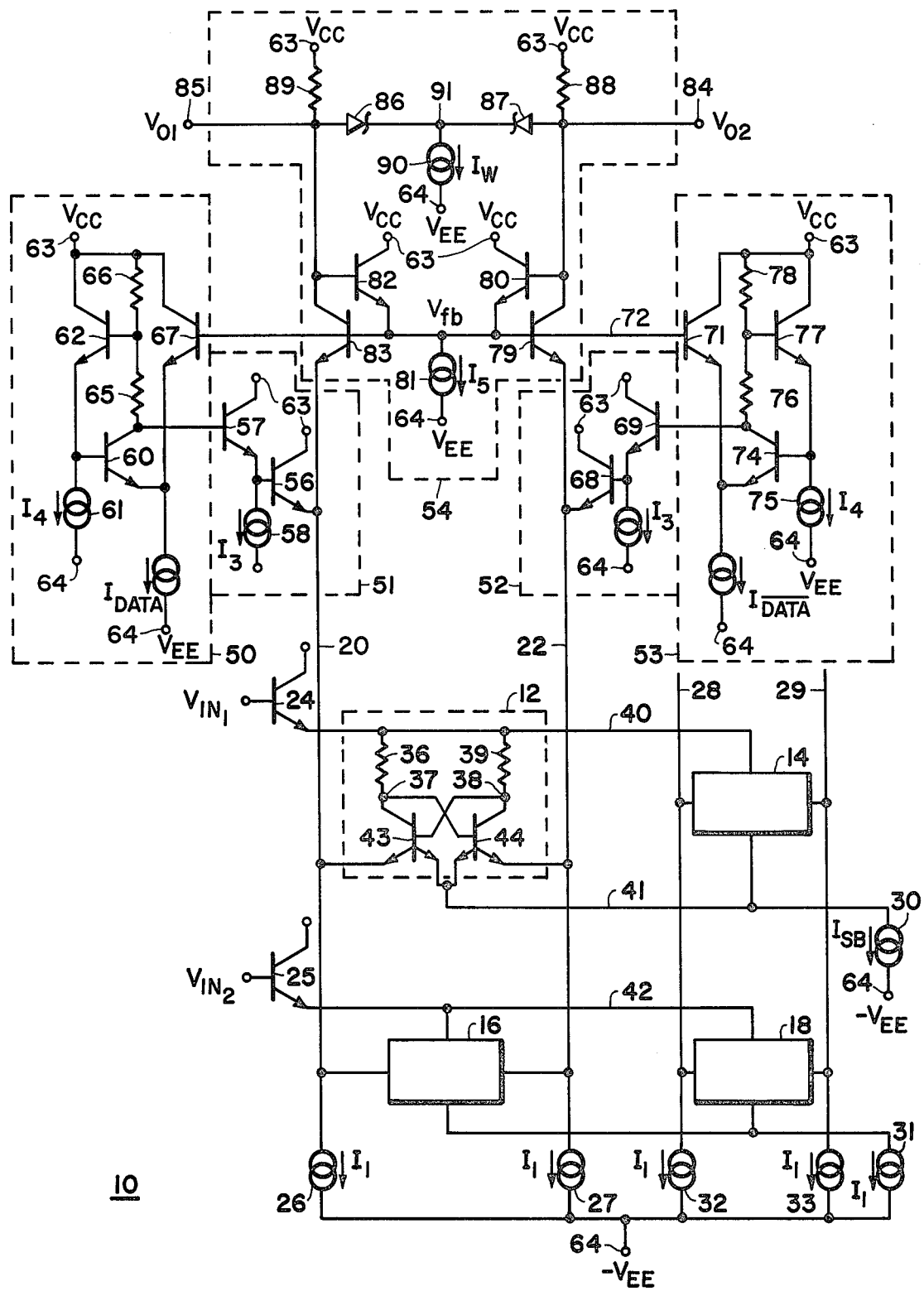

SENSE/WRITE CIRCUITS FOR BIPOLAR RANDOM ACCESS MEMORY

BACKGROUND OF THE INVENTION

Integrated circuit bipolar random access memories (RAMs) have found widespread use in high speed digital computers an intermediate "scratch-pad" memories as well as in numerous other applications. The basic requirements of such bipolar RAMs have been that they provide relatively high speed operation at a relatively low cost, since such memory must often interface between high speed arithmetic sections of digital computers and slower main memories or other circuits coupled thereto. A widely used flip-flop memory cell for such bipolar RAMs includes two cross-coupled inverters each having a resistor as a load device and a dual emitter transistor as a switching device. Two emitters, one from each transistor, are coupled together and are connected to a standby current source and also to the two corresponding emitters of each of the other flip-flop memory cells in the same row. The two other emitters of each flip-flop memory cell are coupled to corresponding sense-write conductors which are shared with the other flip-flop memory cells in the same column of the array of memory cells. Various types of circuits for reading stored information out of and writing logical information into such memory cells have been utilized in the prior art. Some of the circuits require generation of an intermediate threshold voltage having a value between the collector node voltages of the selected flip-flop cell. Other approaches involve use of circuitry which is jointly utilized in the read and write operation. Such circuitry has been subject to undersirable interaction between the read and write functions. Such prior art read-write circuitry has been susceptible to "glitches" which lower the reliability of circuit operation over the required temperature range.

SUMMARY OF THE INVENTION

It is an object of this invention to provide sense-write circuitry for a bipolar random access memory wherein circuit interaction between the read function and the write function is minimized or eliminated.

Briefly described, the invention is a memory circuit including a flip-flop storage cell coupled to a pair of bit conductors. A sense circuit is coupled to one of the bit conductors by a coupling circuit which includes a first transistor having its emitter connected to one of the bit conductors. The sense circuit includes circuitry for establishing a bias voltage at the base of the first transistor responsive to a control input of the read-write circuit. A second transistor has its emitter connected to the base of the first transistor and its base connected to the collector of the first transistor and also to a current-supplying element connected to a voltage conductor. During its sensing operation, the voltage at the base of the first transistor is maintained at a value which ensures that the first transistor is on an on condition, and during the write operation the voltage at the base of the first transistor is maintained at a voltage which ensures that the first transistor is in an off condition. In another embodiment of the invention, a write circuit is coupled to the same bit conductor by means of a third transistor having its emitter connected to the bit conductor. An offset voltage follower circuit responsive to a data input of said memory circuit is coupled to the base of the third transistor for maintaining the base of the third transistor at a voltage slightly below the voltage at the base of the first transistor during a sensing operation and for establishing the bit conductor at a relatively high or a relatively low voltage representative of a logical "1" or logical "0∞ during a write operation.

BRIEF DESCRIPTION OF THE DRAWING

The sole FIGURE is a schematic diagram of a presently preferred embodiment of the invention.

DESCRIPTION OF THE INVENTION

Referring to the Figure, memory circuit 10 includes a plurality of flip-flop memory cells 12, 14, 16 and 18. The memory array formed by the cells is, of course, expandable to include any suitable number of columns and rows of the flip-flop memory cells. All of the memory cells in a given row are connected to a row selection conductor such as row selection conductor 40 or row selection conductor 42. Each row selection conductor is coupled to the emitter of a driver transistor, such as transistor 24, which has its base connected to a decoder circuit (not shown). Of course, only one row of cells can be "selected" at a time. The operation is such that if the top row cells in the figures is selected conductor 40 is at a higher voltage than conductor 42.

The flip-flop memory cell 12, which includes dual emitter transistors 43 and 44 and load resistors 36 and 39 is well known in the art, and its structure and operation will not be described herein. See, for example, U.S. Pat. No. 3,919,566 assigned to the Applicant of the present invention. Each column of memory cells is commonly coupled to a pair of bit lines. In the Figure, memory cells 12 and 16 are coupled to bit conductors 20 and 22; memory cells 14 and 18 are coupled to bit conductors 28 and 29. Bit conductors 20 and 22 are shown as being connected to the additional circuitry at the top of the Figure. Such circuitry, although not shown, is also connected bit conductor 28 and 29.

The sense-write circuitry shown in the upper part of the Figure includes offset voltage follower circuits 50 and 53, write driver circuits 51 and 52, and sense amplifier circuit 54. Driver circuit 51 includes NPN transistor 56 having its collector connected to $V_{CC}$ conductor 63 and its emitter connected bit line 20 and its base connected to one terminal of constant current source 58 which has its other terminal connected to $V_{DD}$ conductor 64. A large variety of suitable constant current source circuits such as 58 are well known in the art and need not be described in detail herein. NPN transistor 57 has its collector connected to $V_{CC}$ conductor 63, its emitter connected to the base of transistor 56 and has its base connected to the collector of NPN transistor 60. Transistors 60 has its emitter connected to switchable constant current source 59, the other terminal of which is connected to $V_{EE}$ conductor 64. Transistor 60 has its base connected to constant current source 61 which is also connected to $V_{EF}$. Resistor 65 is connected between the base of transistor 62 and the collector of transistor 60. Resistor 66 is connected between $V_{CC}$ and the base of transistor 62. Transistor 62 has its collector connected to $V_{CC}$ and its emitter connected to the base of transistor 60. Transistor 67 has its collector connected to $V_{CC}$, its emitter connected to the emitter of transistor 60, and its base connected to node 72. The connections of the transistors in driver circuit 52 and offset voltage follower circuit 53 are connected entirely similarly. Sense amplifier 54 includes constant current source 81 connected between node 72 and $v_{EE}$ and also includes NPN transistor 83 having its base connected to node 72, its emitter connected to bit line 20, and its collector connected to the base of NPN transistor 82, which has its emitter connected to node 72 and its collector connected to $V_{CC}$. Resistor 89 is connected between $V_{CC}$ and node 85, which is connected to the base of transistor 82. Voltage $V_{01}$ is developed at node 85. Diode 86, which may be a Schottky barrier diode, has its anode connected to node 85 and its cathode connected to node 91. Switchable constant current source 90 is connected between node 91 and $V_{EE}$. Transistor 79 has its base connected to node 72, its emitter connected to bit line 22, and its collector connected to the base of transistor 80. NPN transistor 80 has its collector connected to $V_{CC}$, and its emitter connected to node 72. Resistor 88 is connected between $V_{CC}$ and node 84, at which voltage $V_{02}$ is developed, and which is connected to the base of transistor 80. Diode 87 is connected between node 84 and node 91.

The operation of the circuit as described above can be explained by first describing a read operation. Assume that transistor 43 of memory cell 12 is in the on condition and that transistor 44 is therefore off. If memory cell 12 is unselected, the standby current $I_{SB}$ in constant current source 30 is the sum of all of the currents flowing in all of the memory cells in that row. The portion of $I_{SB}$ flowing through transistor 43 holds transistor 44 off. As the row is selected, and $V_{IN2}$ increases, turning transistor 24 off, node 40 rises in voltage, and current through transistor 43 flows into bit line 20 instead of into node 41 and contributes to the current $I_1$ flowing in the switchable constant current source 26. The rest of the current $I_1$ flows through transistor 83 of sense amplifier circuit 54. It is therefore seen that the voltage $V_{fb}$ at node 72 is equal to the base voltage of transistor 43. The voltage $V_{fb}$ is generated and maintained at node 72 by the action of constant current source 81 and transistors 83, 82 and resistor 89. The current flowing in constant current source 27 all flows through transistor 79, since transistor 44 of memory cell 12 is off. Virtually all of the current flowing through constant current source 27 therefore flows through resistor 88. However, only part of the current flowing through constant current source 26 flows through resistor 89, the rest of the current being supplied through memory cell transistor 43. Therefore, $V_{02}$ is lower than $V_{01}$. This voltage differential represents the third logical state stored in memory cell 12. If transistor 44 were on instead of transistor 43, the voltage differential between $V_{01}$ and $V_{02}$ would be of the opposite polarity indicating presence of the opposite stored state.

It should be noted that $V_{fb}$ is also fed to other pairs of transistors such as 83 and 79 which are coupled, correspondingly, to other pairs of bit lines such as 28 and 29. As mentioned above, row selection is accomplished by means of decoded signals (not shown) applied to the bases of transistors such as 24 or 25. Column selection is achieved by means of decoded control signals (not shown) which turn off switchable constant current sources $I_1$ of the unselected columns of memory cells. During the sensing operation, $I_W$, the current through switchable constant current source 90, is equal to zero, and $I_{DATA}$ equals $I_{\overline{DATA}}$. $I_{DATA}$ and $I_{\overline{DATA}}$ have a value during the sensing operation which, in conjunction with resistors 66 and 65 and transistor 57, establishes the base of transistor 56 at a voltage less than the voltage of the base of transistor 83 by the amount of the voltage drop across resistor 65. Similarly, the voltage at the base of transistor 68 is less than the voltage at the base of transistor 79 by the amount of the voltage drop across resistor 76. Clearly, if the voltage drops across resistors 65 and 76 are sufficiently large, transistors 56 and 68 will be off during the entire sensing operation and will have no affect on the operation of the sense circuitry or the memory cells.

In order to write data into memory cell 12 (for example) two conditions must exit. First, the voltage of one bit line (20 or 22) must be lowered to allow the transistor of one side of the memory cell (transistor 43 or transistor 44) to conduct the bit line current $I_1$ of the adjacent bit line. Second, the other bit line voltage must be raised to insure that the other memory cell transistor connects none of the bit line current $I_1$ of the adjacent bit line. These conditions are achieved by switching "on" the current $I_W$ through switchable constant current source 90. Current flows through Schottky diodes 86 and 87, lowering the voltage at nodes 84 and 85. Consequently, $V_{fb}$, at node 72, is also lowered. This causes bit lines 20 and 22 to be lowered. Concurrently, depending on which logical state is to be written into memory cell 12, either $I_{DATA}$ or $I_{\overline{DATA}}$ is switched off. This causes the voltage at the base of either transistor 57 or transistor 69 to be raised to $V_{CC}$ volts. Either transistor 56 or transistor 68 will then be forced to conduct all of the bit line current of the bit line (20 or 22) connected thereto. Since $V_{fb}$ will be lowered to a voltage lower than that applied to the base of either transistor 56 or 68 when $I_{DATA}$ or $I_{\overline{DATA}}$ is on, both of transistors 83 and 79 will be turned off during the write operation. Consequently, one of the memory cell transistors 43 or 44 will be forced to conduct all of the bit line current $I_1$ of whichever bit line (20 or 22) is at the lower voltage (depending on whether $I_{DATA}$ or $I_{\overline{DATA}}$ is off). The voltage applied to the bases of transistors 56 and 68 may be designed to be only slightly lower than $V_{fb}$ during a sensing operation; this permits very fast subsequent writing operations because the magnitude of the required voltage transition for a write operation as reduced.

The above circuit provides the advantage of separating the sensing and writing functions of the memory circuit and therefore reduces the interaction between the sense and write functions, and eliminates "glitches" which occur during a write function of previous sense-write circuits. Further, the magnitude of voltage swings of the bit lines to change the storage state of the memory cell are reduced, consequently improving the write speed of the circuit. Further, during a write operation, a selected memory cell conducts the entire amount of the bit line current, thereby improving the switching speed of the memory cell. Further, during a write operation, the sense amplifier transistors are turned off. This eliminates the possibility of saturating these devices (transistors 83 and 79). This provides greater design freedom in choosing sense amplifier resistor values (89 and 88) and bit line current source values ($I_1$) and thereby results in improvement in circuit operation over large ranges in temperature.

What is claimed is:
1. A memory circuit comprising:
 a storage cell, said storage cell being a read/write type of storage cell;
 bit conductor means coupled to said storage cell for transferring information to and from said storage cell;
 sense circuit means coupled to said bit conductor means for sensing a stored state of said storage cell during a sensing operation of said memory circuit; and coupling means coupled between said bit conductor means and said sense circuit means for operatively coupling said storage cell to said sense circuit means via said bit conductor means during said sensing operation and operatively isolating said sense circuit means from said storage cell during an operation of writing into said storage cell.

2. A memory circuit as recited in claim 1 further including write circuit means coupled to said bit conductor means for writing information into said storage cell during said write operation, and second coupling means coupled between said bit conductor means and said write circuit means for operatively coupling said storage cell to said write circuit means via said bit conductor means during said writing operation and operatively isolating said write circuit means from said storage cell during said sensing operation of said memory circuit.

3. The memory circuit as recited in claim 1 wherein said storage cell is a flip-flop circuit having an emitter coupled to said bit conductor means.

4. A memory circuit as recited in claim 1 wherein said coupling means includes a first transistor having an emitter connected to said bit conductor means and its base connected to an emitter of a second transistor and its collector connected to the base of said second transistor.

5. A memory circuit as recited in claim 4 further including a constant current source circuit coupled between the emitter of said second transistor and a first voltage conductor and also including a resistive current-providing element coupled between the base of said second transistor and the second voltage conductor.

6. A memory circuit as recited in claim 5, further including a switchable current source element coupled to base of said second transistor for controlling the voltage at the base of said first transistor.

7. A memory circuit as recited in claim 2 wherein said second coupling means includes a transistor having an emitter coupled to said bit conductor means and a base coupled to said write circuit means, and said write circuit means includes an emitter follower circuit having an emitter coupled to the base of said transistor and having its input coupled to an offset voltage follower circuit.

8. A memory circuit as recited in claim 7 wherein said voltage follower circuit includes a switchable constant current source circuit controlled by a data input to said memory circuit, and includes a second transistor having its emitter coupled to said switchable constant current source circuit and its base coupled to an emitter of a third transistor and its collector coupled to the input of said emitter follower circuit and to a first resistor having another electrode coupled to the base of said third transistor, the base of said third transistor also being coupled to a second resistor having another terminal coupled to a voltage conductor.

* * * * *